(12) United States Patent
Ishimoto et al.

(10) Patent No.: US 8,212,904 B2
(45) Date of Patent: Jul. 3, 2012

(54) SOLID-STATE IMAGING DEVICE HAVING HIGH FLOATING DIFFUSION RESET POTENTIAL

(75) Inventors: Hisato Ishimoto, Hyogo (JP); Masashi Murakami, Kyoto (JP)

(73) Assignee: Panasonic Corporation, Osaka (JP)

( * ) Notice: Subject to any disclaimer, the term of this patent is extended or adjusted under 35 U.S.C. 154(b) by 268 days.

(21) Appl. No.: 12/489,674

(22) Filed: Jun. 23, 2009

(65) Prior Publication Data

US 2009/0322921 A1  Dec. 31, 2009

(30) Foreign Application Priority Data

Jun. 27, 2008 (JP) ................. 2008-169457

(51) Int. Cl.
*H04N 3/14* (2006.01)
*H04N 5/335* (2011.01)
(52) U.S. Cl. ...................................... 348/301
(58) Field of Classification Search .................. 348/301
See application file for complete search history.

(56) References Cited

U.S. PATENT DOCUMENTS

| | | | |
|---|---|---|---|
| 6,946,636 | B2 | 9/2005 | Eguchi et al. |
| 7,119,840 | B2 | 10/2006 | Mabuchi |
| 7,176,462 | B2 | 2/2007 | Mabuchi |
| 7,242,043 | B2 | 7/2007 | Ohkawa |
| 7,394,492 | B2 | 7/2008 | Shinohara |
| 7,705,899 | B2 * | 4/2010 | Koyama et al. ............... 348/301 |
| 8,085,326 | B2 * | 12/2011 | Tanaka ........................... 348/308 |
| 8,144,225 | B2 * | 3/2012 | Watanabe et al. ............ 348/301 |
| 2002/0051229 | A1 | 5/2002 | Eguchi et al. |
| 2004/0113151 | A1 * | 6/2004 | Sekine ............................ 257/72 |
| 2004/0239791 | A1 | 12/2004 | Mabuchi |
| 2005/0062867 | A1 | 3/2005 | Mabuchi |
| 2005/0067640 | A1 | 3/2005 | Ohkawa |
| 2005/0121519 | A1 | 6/2005 | Shinohara |
| 2005/0248674 | A1 | 11/2005 | Mabuchi et al. |
| 2006/0102827 | A1 | 5/2006 | Kasuga et al. |
| 2006/0285000 | A1 | 12/2006 | Mabuchi |

(Continued)

FOREIGN PATENT DOCUMENTS

JP    2001-320630    11/2001

(Continued)

OTHER PUBLICATIONS

English language Abstract of JP 2005-86595, Mar. 31, 2005.

(Continued)

*Primary Examiner* — Albert Cutler
(74) *Attorney, Agent, or Firm* — Greenblum & Bernstein, P.L.C.

(57) ABSTRACT

A solid-state imaging device includes plural pixel cells, arranged in a matrix, each of which includes a photodiode that photoelectrically converts incident light. The solid-state imaging devices also includes a transferring transistor that transfers a charge generated by the photodiode, a floating diffusion that accumulates the transferred charge, a reset transistor that resets a potential of said floating diffusion, and an amplifying transistor that converts the charge accumulated in the floating diffusion into a voltage. The solid-state imaging device further includes column signal lines, each connected to associated ones of plurality of amplifying transistors, including the amplifying transistor corresponding to a corresponding one of columns having the associated plurality of pixel cells, and a voltage control circuit which increases a voltage of the column signal line to a predetermined voltage between the reset of the potential by the reset transistor and the transfer of the charge by the transferring transistor.

12 Claims, 14 Drawing Sheets

U.S. PATENT DOCUMENTS

| | | |
|---|---|---|
| 2007/0103574 A1 | 5/2007 | Tanaka |
| 2007/0146516 A1 | 6/2007 | Nezaki et al. |
| 2007/0252184 A1 | 11/2007 | Ohkawa |
| 2007/0296844 A1 | 12/2007 | Tanaka |
| 2008/0061216 A1 | 3/2008 | Kasuga et al. |
| 2008/0170147 A1* | 7/2008 | Barbier et al. ............ 348/308 |
| 2009/0033782 A1 | 2/2009 | Muroshima et al. |
| 2009/0066825 A1 | 3/2009 | Nezaki et al. |

FOREIGN PATENT DOCUMENTS

| | | |
|---|---|---|
| JP | 2002-330351 | 11/2002 |
| JP | 2004-335582 | 11/2004 |
| JP | 2005-86595 | 3/2005 |
| JP | 2005-101442 | 4/2005 |
| JP | 2005-192191 | 7/2005 |
| JP | 2007-104186 | 4/2007 |
| JP | 2007-123604 | 5/2007 |

OTHER PUBLICATIONS

Japan Office Action, mailed Apr. 17, 2012, for corresponding Japanese Patent Application No. 2008-169457.

* cited by examiner

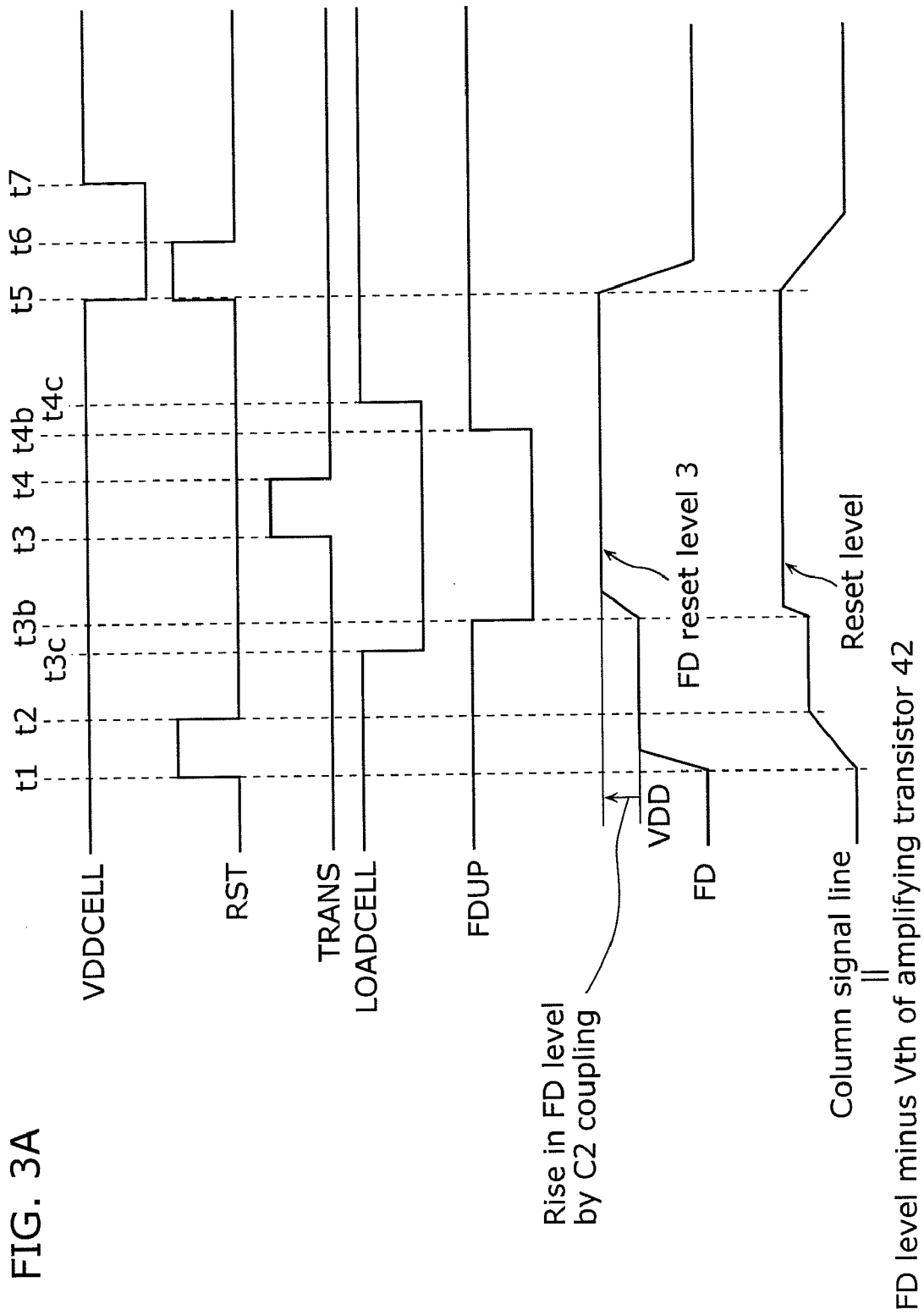

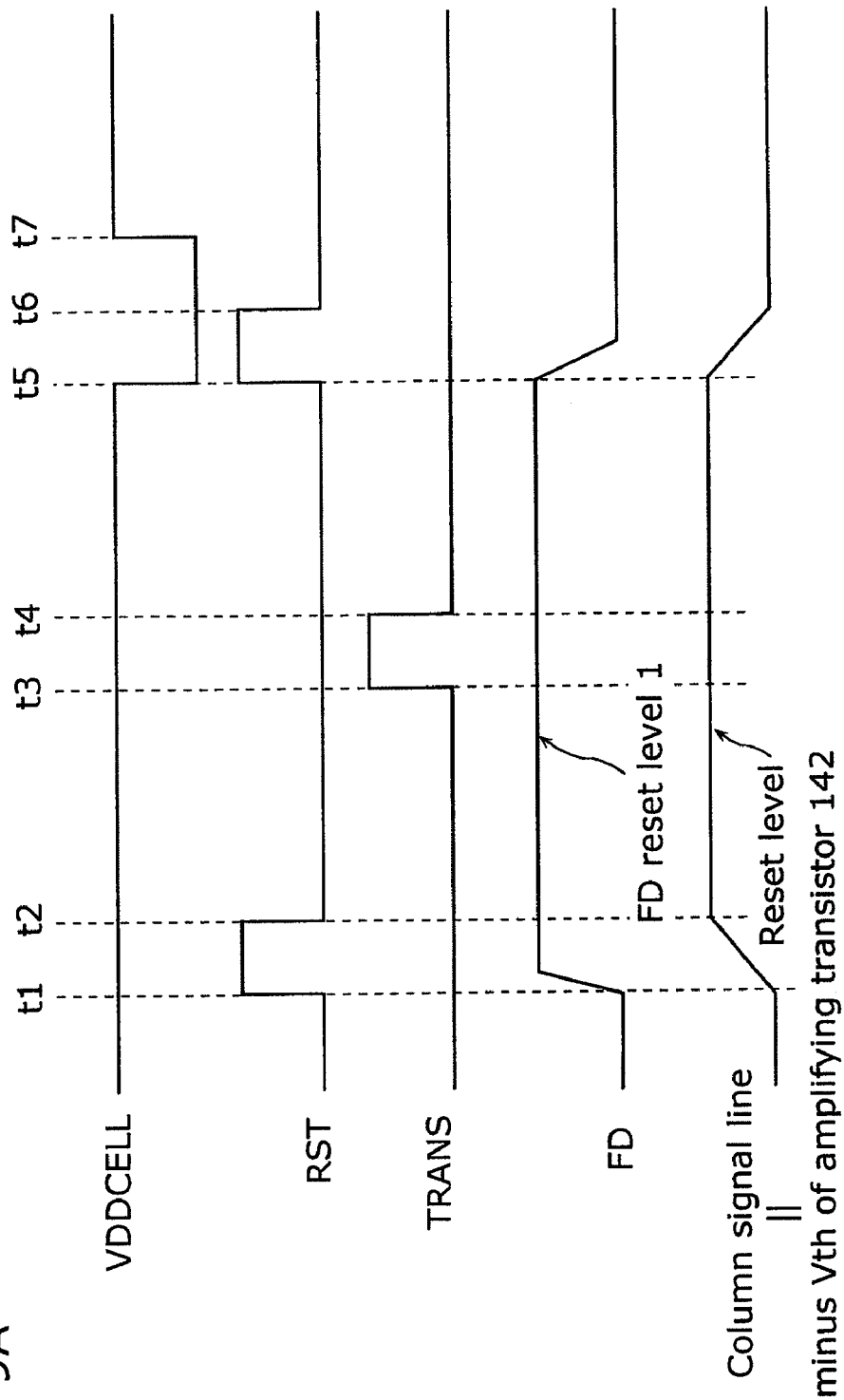

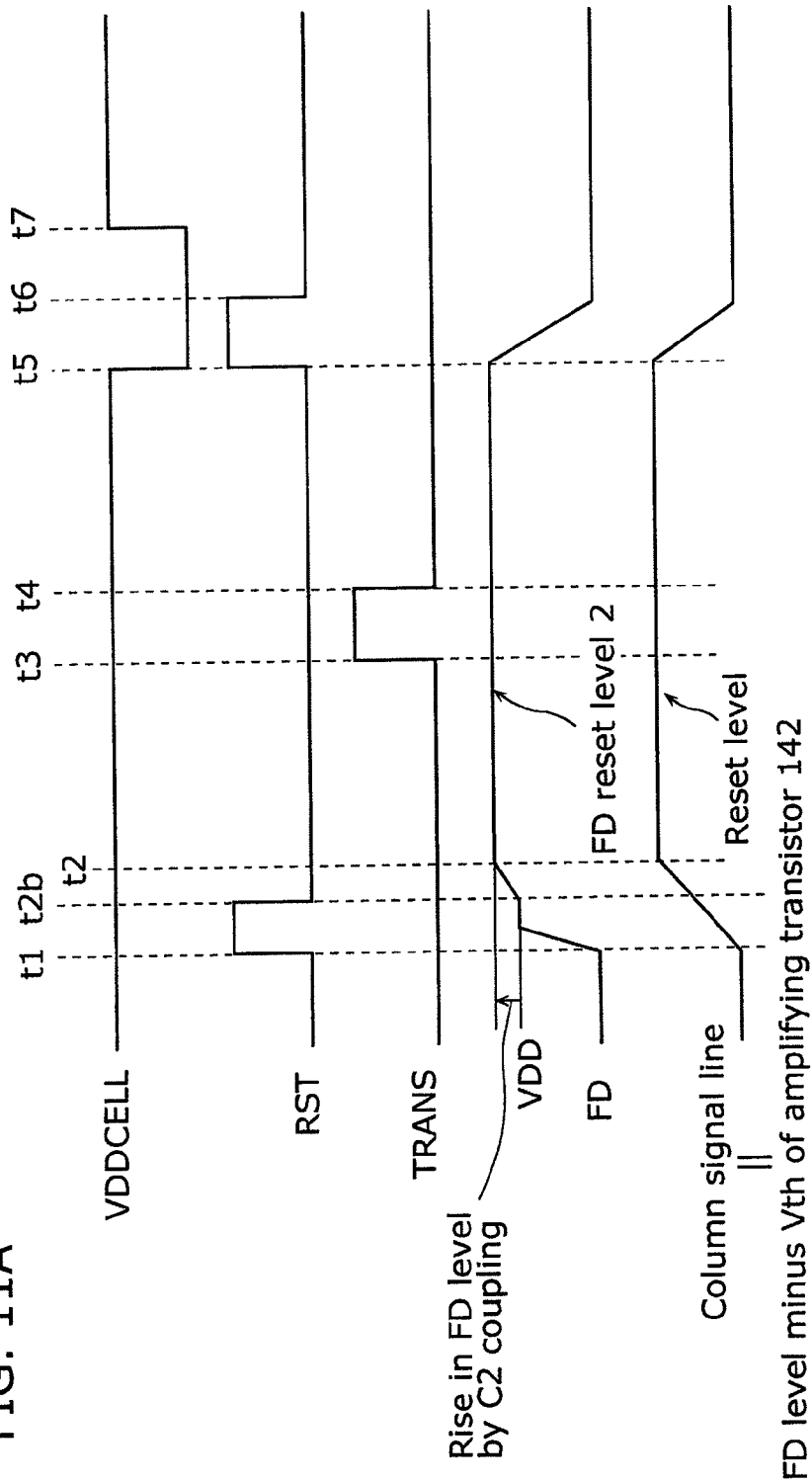

SOLID-STATE IMAGING DEVICE HAVING HIGH FLOATING DIFFUSION RESET POTENTIAL

BACKGROUND OF THE INVENTION (1) Field of the Invention

The present invention relates to a solid-state imaging device including plural pixel cells arranged in a matrix, and a column signal lines connected to plural amplifying transistors corresponding to a column of the associated plural pixel cells.

(2) Description of the Related Arts

Recently, manufacturers are promoting developments of MOS solid-state image sensors as solid-state imaging devices applicable to video cameras and electronic still cameras. These solid-state imaging devices are structured to amplify, using a MOS transistor, a signal obtained by a photoelectric conversion unit on a cell basis, and pick up the amplified signal.

FIG. 8 is a circuit diagram illustrating a unit pixel included in a conventional solid-state imaging device having a MOS transistor and a circuit surrounding the unit pixel.

A unit pixel 103 included in a MOS image sensor has a photodiode (PD) 132, a transfer transistor 134, a floating diffusion (FD) 138, a reset transistor 136, and an amplifying transistor 142.

The photodiode (PD) 132 photoelectrically converts incident light to generate a charge.

Next, when the transfer transistor 134 turns on, the charge generated by the photodiode (PD) 132 is transferred to the floating diffusion (FD) 138.

Described herewith is an externally-reading operation from the unit pixel 103 via a column signal line 153. First, the floating diffusion (FD) 138 is reset at a high level of voltage. Then, a photocharge detected by the photodiode (PD) 132 is transferred to the floating diffusion (FD) 138. The level of voltage of the floating diffusion (FD) 138 varies depending on the charge amount. Next, the amplifying transistor 142 forwards to the column signal line 153 the change in the level of voltage of the floating diffusion (FD) 138 as a pixel signal.

The following shall provide a brief description of an operation of a circuit in the conventional solid-state imaging device with reference to a timing diagram and a potential diagram of the conventional solid-state imaging device.

FIGS. 9A and 9B are timing diagrams showing the operation of the conventional solid-state imaging device. The drawings show timings of a drain driving pulse VDDCELL applied to a drain line 157, a reset signal RST applied to a reset line 156, a transfer gate pulse TRANS applied to a transfer gate line 155, the floating diffusion (FD) 138, and the column signal line 153.

Here, FIG. 9A is a timing diagram showing the operation of the conventional solid-state imaging device with no electric charge applied on the photodiode (PD) 132. Meanwhile, FIG. 9B is a timing diagram showing the operation of the conventional solid-state imaging device with an electric charge applied to the photodiode (PD) 132.

In FIGS. 9A and 9B, first, the drain driving pulse VDDCELL (high level) is applied to the drain line 157, so that the drain line 157 is brought to a VDD level (high level). Next, when the reset signal RST (high level) is applied to the reset line 156 to rise (t1), the reset transistor 136 turns on, and the floating diffusion (FD) 138 is brought high (t1 to t2, FD reset level of voltage 1).

Then, the reset signal RST falls (t2).

A voltage of the column signal line 153 (reset level) is provided to a circuit, in a next stage, connected at the column signal line 153, the voltage which has decreased from a voltage of the floating diffusion (FD) 138 (FD reset level of voltage 1) by a drain-gate voltage (Vth) of the amplifying transistor 142.

Then, the transfer gate pulse TRANS (high level) is applied to the transfer gate line 155 (t3 to t4). Here, when no incident light is transferred into the photodiode (PD) 132, and thus no signal charge (photoelectron) is accumulated in the photodiode (PD) 132, the level of voltage of the floating diffusion (FD) 138 remains to be the FD reset level of voltage 1, and is unchanged (t3 to t5 in FIG. 9A) even though the transfer transistor 134 turns on.

Meanwhile, when incident light is transferred into the photodiode (PD) 132, and thus a signal charge (photoelectron) is accumulated in the photodiode (PD) 132, the signal charge (photoelectron) is transferred from the photodiode (PD) 132 to the floating diffusion (FD) 138, and then the level of voltage of the floating diffusion (FD) 138 goes low depending on the signal charge (photoelectron). The voltage of the column signal line 153 lowered by the drain-gate voltage (Vth) of the amplifying transistor 142 goes low (t3 to t5 in FIG. 9B), following the lowered level of voltage of the floating diffusion (FD) 138. The potential (signal level) of the column signal line 153 is provided again to the circuit in the next stage.

Then, setting the drain driving pulse VDDCELL to a low level and applying the reset signal RST to the reset transistor 136 (t5 to t6) is brings the floating diffusion (FD) 138 to a low level (from t5 downward). The circuit in the next stage detects the difference between the reset level and the signal level, and forwards the difference as a pixel signal.

Described next are potentials of the photodiode (PD) 132 and the floating diffusion (FD) 138 when the incident light is transferred into the photodiode (PD) 132, and then the signal charge (photoelectron) is accumulated in the photodiode (PD) 132.

FIG. 10 shows potentials of the photodiode (PD) 132 and the floating diffusion (FD) 138 in the conventional solid-state imaging device. The horizontal direction indicates locations of the photodiode (PD) 132 and the floating diffusion (FD) 138, and the vertical direction indicates potentials (high as indicated bottom).

Receiving the incident light, the photodiode (PD) 132 generates the signal charge (photoelectron) (FIG. 10(a)).

Next, when the transfer gate pulse TRANS (high level) is applied to the transfer gate line 155, the signal charge (photoelectron) generated by the photodiode (PD) 132 is transferred to the floating diffusion (FD) 138 (FIG. 10(b)). Here, the level of voltage of the floating diffusion (FD) 138 goes low depending on the transferred signal charge.

Then, when the transfer gate pulse TRANS becomes a low level again, the photodiode (PD) 132 and the floating diffusion (FD) 138 are blocked (FIG. 10(c)).

Since recent miniaturization of solid-state imaging devices formed out of semi-conductor causes a decrease in breakdown voltage, resulting in a lower power supply voltage, the signal charge (photoelectron) received at the floating diffusion (FD) 138; namely an FD capacitance, decreases. The decrease in the FD capacitance lowers the number of saturated electrons in the floating diffusion (FD) 138 and makes detection of high intensity luminance impossible, resulting in a lower dynamic range. The decrease also causes difficulty in transferring to the floating diffusion (FD) 138 the signal charge (photoelectron) generated by the photodiode (PD) 132, leading to producing residual image electrons in the photodiode (PD) 132.

Patent Reference 1 (Japanese Unexamined Patent Application Publication No. 2005-86595) describes a solid-state imaging device having an increased FD capacitance to avoid producing residual image electrons.

The solid-state imaging device in Patent Reference 1 takes advantage of the coupling of parasitic capacitance C102 generated between the column signal line 153 and the floating diffusion (FD) 138 in FIG. 8 to increase a reset level of voltage (FD reset level of voltage) of the floating diffusion (FD) 138 greater than a power supply voltage VDD in order to increase the FD capacitance (hereinafter referred to as a coupling effect of C102). Illustrated next in FIGS. 11A and 11B are timing diagrams of the solid-state imaging device described in Patent Reference 1.

Here, FIG. 11A is a timing diagram showing the operation of the conventional solid-state imaging device in Patent Reference 1 with no electric charge generated by the photodiode (PD) 132.

FIG. 11B is a timing diagram showing the operation of the conventional solid-state imaging device in Patent Reference 1 with an electric charge generated by the photodiode (PD) 132.

Compared with the conventional example 1, the solid-state imaging device in Patent Reference 1 is characterized to have a high level period (t1 to t2b) of the reset signal RST shorter than a rising period (t1 to t2) of a column signal line.

This causes the rise of the column signal line 153 in the t2b to t2 period in FIGS. 11A and 11B to bring the level of voltage of the floating diffusion (FD) 138 high via the parasitic capacitance C102 existing between the column signal line 153 and the floating diffusion (FD) 138 in FIG. 8. Hence, the FD reset level of voltage 2 in FIG. 11B is higher than the potential in the conventional example 1 (FD reset level of voltage 1 in FIG. 9B). This allows the solid-state imaging device described in Patent Reference 1 to store as many signal charges (photoelectrons) as possible in the floating diffusion (FD) 138 in order to prevent residual images.

SUMMARY OF THE INVENTION

In the reset signal RST high level period between t1 to t2b shown in FIGS. 11A and 11B, however, the reset transistor 136 in FIG. 8 turns on, and the level of voltage of the floating diffusion (FD) 138 is fixed to the FD reset potential 1. Thus no coupling effect of C102 is obtained. An actual period in which the coupling effect of the C102 is available is a period that the reset signal RST becomes a low level and that the floating diffusion (FD) 138 is in a floating state by turning the reset transistor 136 off, as well as a period in which the level of voltage of the column signal line 153 rises by the output from the amplifying transistor 142. Thus, t2b to t2 in FIGS. 11A and 11B is the only period that the coupling effect of the C102 is available.

Since the period is short in obtaining the coupling effect of the C102, increase in FD capacitance caused by a rise in FD reset level of voltage may be limited, causing possible residual image electrons.

Thus, the present invention is conceived in view of the above problems and has as an objective to provide an imaging device making possible detecting up to higher intensity luminance, having a wide dynamic range, and producing less residual images by setting an FD reset potential high and increasing an FD capacitance free from restrictions such as miniaturization of a solid-state imaging element, lowering a power source voltage, and a period in which the coupling effect is obtainable.

In order to achieve the above objective, a solid-state imaging device in the present invention includes: a plurality of pixel cells, arranged in a matrix, each of which includes a photodiode which photoelectrically converts incident light, a transferring transistor which transfers a charge generated by the photodiode, a floating diffusion which accumulates the transferred charge, a reset transistor which resets a potential of the floating diffusion, and an amplifying transistor which converts the charge accumulated in the floating diffusion into a voltage; column signal lines each connected to associated ones of plurality of amplifying transistors including the amplifying transistor corresponding to a corresponding one of columns having the associated plurality of pixel cells; and a voltage control circuit which increases a voltage of the column signal line to a predetermined voltage between the reset of the potential by the reset transistor and the transfer of the charge by the transferring transistor.

According to the above structure, a voltage of the column signal line rises to a predetermined voltage after the reset and prior to the transmission of the charge. Hence, prior to the transmission, the level of voltage of the floating diffusion can be raised higher than a level of voltage after the reset via a capacitive coupling caused by parasitic capacitance generated between the column signal line and the floating diffusion. This makes possible increasing an FD capacitance, detecting up to higher intensity luminance, and having a wide dynamic range, as well as producing less residual images.

The solid-state imaging device may further include a load transistor which corresponds to an associated one of the column signal lines and provide a load to each of the amplifying transistors connected to a corresponding one of the column signal lines, wherein the load transistor is electrically disconnected from the column signal line during a period of the transfer.

Since eliminating an effect of the load transistor when the voltage of the column signal line increases to a predetermined voltage during the period of the transmission, this structure can ensure to increase the voltage of the column signal line to a higher voltage.

Moreover, the voltage control circuit includes a voltage control transistor which corresponds to the associated one of the column signal lines, has a source connected to a bias line having a voltage as high as a voltage of a power supply voltage or more, and has a drain connected to the column signal line, and the voltage control transistor supplies the column signal line with predetermined voltage after the reset and prior to the transfer according to a control signal applied to a gate.

According to this structure, the voltage control circuit includes a voltage control transistor with respect to each column signal line. Hence, this makes possible implementing a voltage control circuit with the circuit size reduced.

In addition, the voltage control transistor may turn on immediately before the period of the transfer and turn off immediately after the transfer Since this structure allows the solid-state imaging device in the present invention to be free from a limitation of timing as observed in the conventional technique, the voltage of the column signal line can fully be increased.

Further, the voltage control transistor turns on after the load transistor is electrically disconnected from the column signal line and immediately before the period of the transfer, and turns off immediately after the transfer so that the load transistor is electrically connected to the column signal line.

According to this structure, the voltage control transistor turns on after causing the column signal line to be in a floating state. This makes possible increasing the voltage of the column signal line free from an effect of the load transistor.

Moreover, the solid-state imaging device may include plural photodiodes having the photodiode for the floating diffusion.

Even though further miniaturization of solid-state imaging devices results in fewer saturated electrons per photodiode, this structure makes possible increasing the number of saturated electrons per unit pixel by combining plural photodiodes. This can detect high intensity luminance and improve a dynamic range.

In addition, the column signal line is arranged on an upper layer of the floating diffusion.

Since this structure increases the parasitic capacitance generated between the floating diffusion and the column signal line, the solid-state imaging device in the present invention can enhance an effect of raising a level of voltage of the floating diffusion caused by capacitive coupling.

As described above, the present invention can provide an imaging device making possible detecting up to higher intensity luminance, having a wide dynamic range, and producing less residual images by setting a floating diffusion (FD) reset potential high, and increasing a floating diffusion capacitance (FD) and the number of saturated electrons received by the floating diffusion (FD) free from restrictions such as miniaturization of a solid-state imaging element, lowering a power source voltage, and a period in which the coupling effect between the column signal line and the floating diffusion is obtainable.

FURTHER INFORMATION ABOUT TECHNICAL BACKGROUND TO THIS APPLICATION

The disclosure of Japanese Patent Application No. 2008-169457 filed on Jun. 27, 2008 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings which illustrate a specific embodiment of the invention. In the Drawings:

FIG. 3A is a timing diagram showing an operation of a solid-state imaging device in embodiment with no electric charge generated by a photodiode (PD) 32.

FIG. 9A is a timing diagram showing an operation of the conventional solid-state imaging device with no electric charge generated by a photodiode (PD) 132;

FIG. 11A is a timing diagram showing an operation of a solid-state imaging device in Patent Reference 1 with no electric charge generated by the photodiode (PD) 132.

DESCRIPTION OF THE PREFERRED EMBODIMENT

Described hereinafter is an embodiment of the present invention with reference to the drawings.

Embodiment

Figure 1:
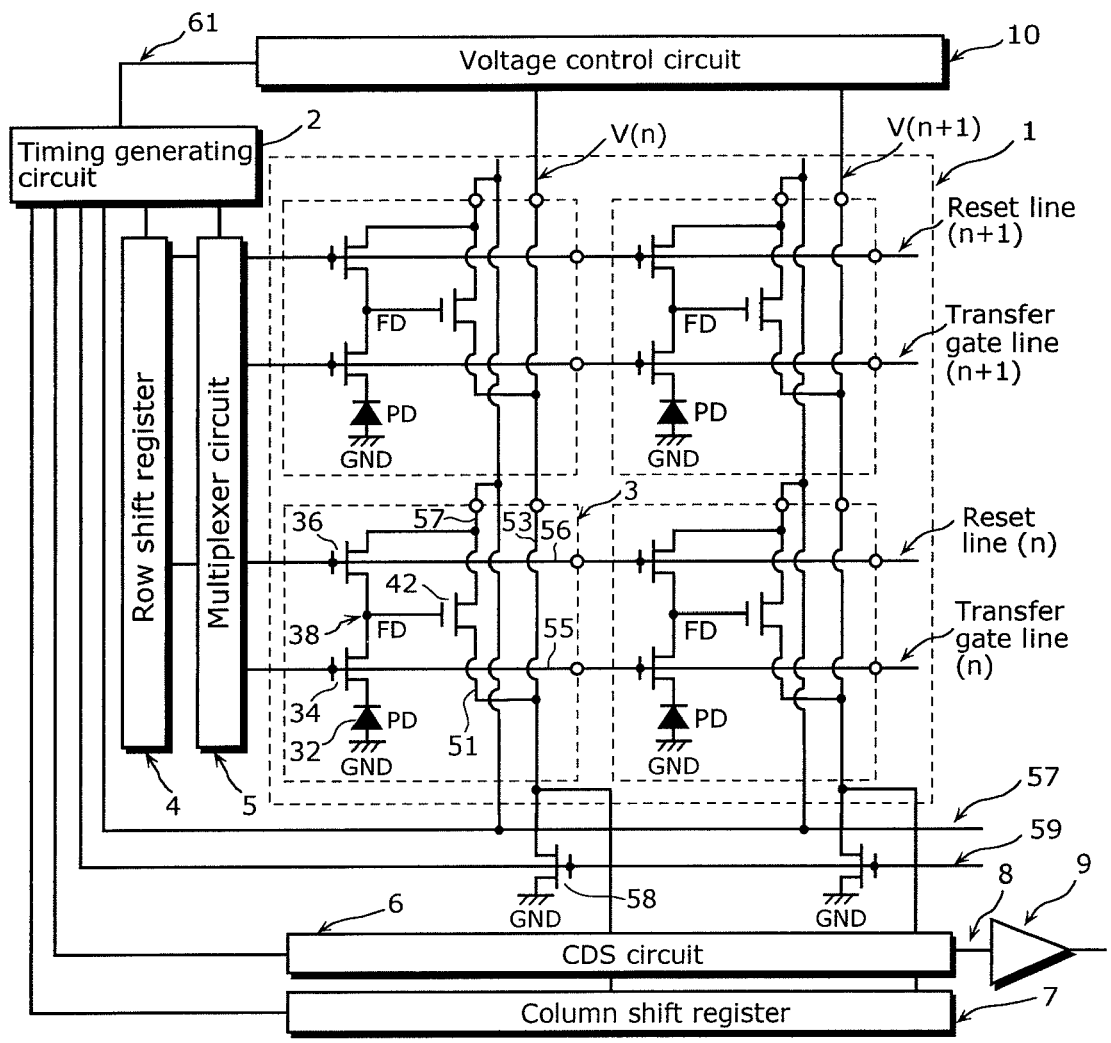
FIG. 1 is a block diagram showing a structure of a solid-state imaging device in embodiment of the present invention.

FIG. 1 is a block diagram showing a structure of a solid-state imaging device in embodiment of the present invention.

The solid-state imaging device in FIG. 1 includes plural unit pixels 3, column signal lines 53, a timing generating circuit 2, a row shift register 4, a multiplexer circuit 5, a Correlated Double Sampling (CDS) circuit 6, a column shift register 7, a row signal line 8, an output amplifier 9, and a voltage control circuit 10. Here, each of the column signal lines 53 is connected to associated amplifying transistors corresponding to an associated column of the corresponding unit pixels 3.

The column signal line 53 is connected to the associated column of the corresponding unit pixels 3, and provides to the CDS circuit 6 a is signal forwarded from the associated unit pixel 3. Here, the connected column signal line 53 and each of unit pixels 3 are arranged on the same column. The column signal lines connected to pixels on the nth column and the n+1th column are respectively referred to as V(n), and V(n+1).

The timing generating circuit 2 is connected to a drain line 57, a load gate line 59, the CDS circuit 6, the column shift register 7, the row shift register 4, and the multiplexer circuit 5. The timing generating circuit 2 provides a signal to each of the processing units at an after-described timing.

Based on the signal forwarded from the timing generating circuit 2, the row shift register 4 provides to the multiplexer circuit 5 a signal to select the plural unit pixels 3 on a column basis.

According to the signals provided from the row shift register 4 and the timing generating circuit 2, the multiplexer circuit 5 controls the plural unit pixels 3 on a column basis. This enables the multiplexer circuit 5 to switch controls between an after-described transfer transistor and a reset transistor in order to control the plural unit pixels 3 on a column basis.

The CDS circuit 6, connected to the column signal line 53 and the timing generating circuit 2, eliminates a signal noise out of the signal provided from the column signal line 53, and holds the signal having no signal noise.

The signal provided from the timing generating circuit 2 drives the column shift register 7 connected to the CDS circuit 6 and the timing generating circuit 2. This causes the signal, on a unit pixel 3 basis, held in the CDS circuit 6 to be outputted from output amplifier 9 via the row signal line 8.

The signal provided from the timing generating circuit 2 drives the voltage control circuit 10 connected to the timing generating circuit 2 and the column signal line 53. This enables a voltage of the column signal line 53 to be increased to a predetermined voltage after resetting by the reset transistor and before the transferring by the transfer transistor.

Each unit pixel 3 generates a voltage depending on incident is light. A detailed description of the unit pixel 3 shall be provided hereinafter.

It is noted that FIG. 1 offers a 2×2 pixel array; however, the size shall not be limited to this.

Described next are structures of the unit pixel 3 and a circuit surrounding the unit pixel 3 of the solid-state imaging device in embodiment of the present invention.

Figure 2:
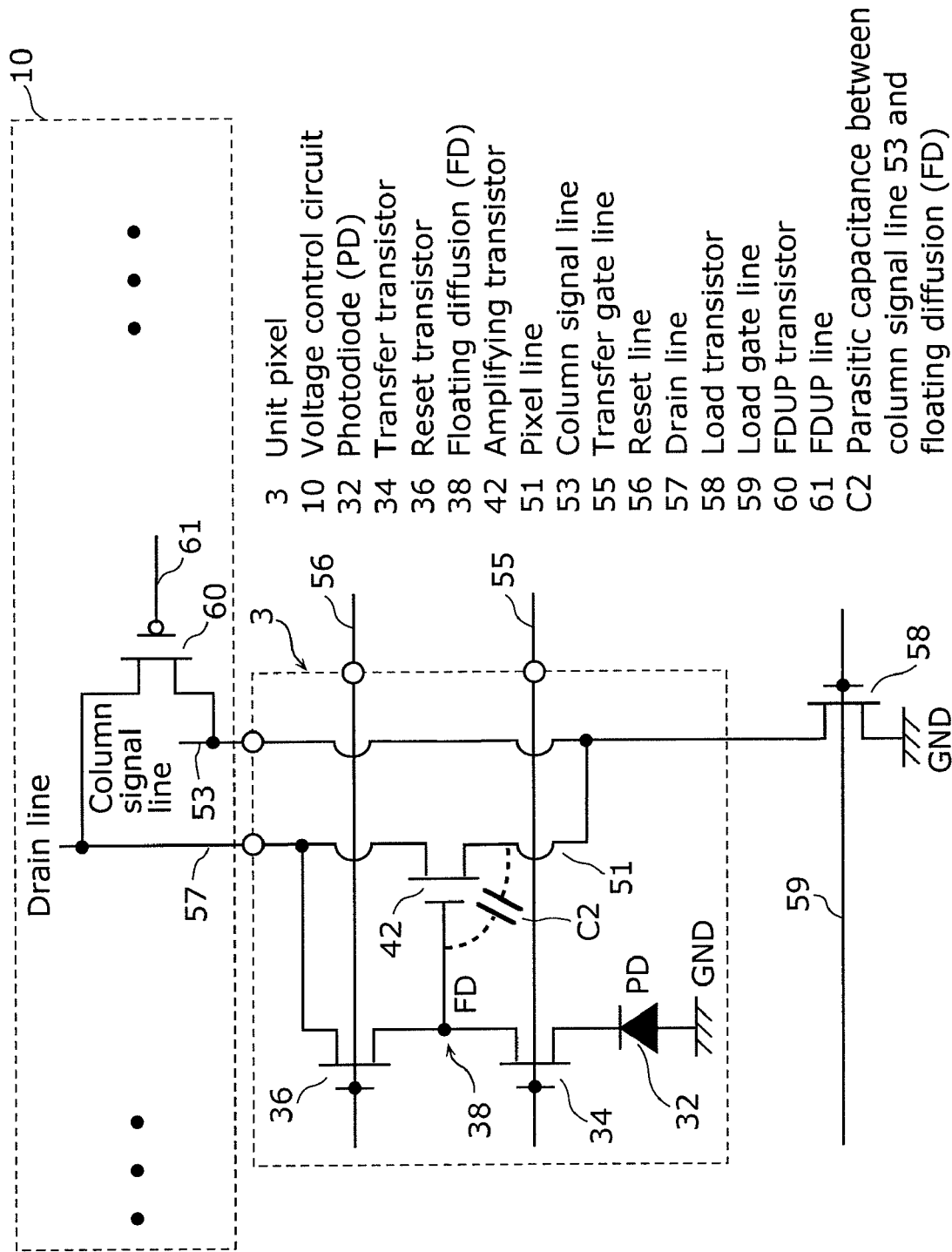
FIG. 2 is a circuit diagram showing structures of a unit pixel 3 and a circuit surrounding the unit pixel 3 in embodiment of the present invention.

FIG. 2 is a circuit diagram showing the structures of the unit pixel 3 and the circuit surrounding the unit pixel 3 in embodiment of the present invention.

FIG. 2 illustrates the voltage control circuit 10, one of the unit pixels 3, and a load transistor 58, all of which correspond to one column signal line.

The voltage control circuit 10 controls voltages of the drain line 57 and the column signal line 53. The voltage control circuit 10 includes one FDUP transistor 60 per a column signal line on an associated unit pixel column. The FDUP transistor 60 is, for example, a p-type MOS transistor. It is noted that the FDUP transistor 60 acts as a voltage control transistor.

The source and the drain of the FDUP transistor 60 are respectively connected to the drain line 57 and the column signal line 53. The gate of the FDUP transistor 60 is connected to the timing generating circuit 2 via an FDUP line 61. The signal from the timing generating circuit 2 turns the FDUP transistor 60 on and off. Here, in the case where the FDUP transistor 60 is a p-type MOS transistor, the FDUP transistor 60 turns on and off when the FDUP line 61 is in a low level and a high level, respectively.

The unit pixel 3 includes a photodiode (PD) 32, a transfer transistor 34, a floating diffusion (FD) 38, a reset transistor 36, and an amplifying transistor 42. Here, the PD 32 photoelectrically converts incident light, the transfer transistor 34 transfers a charge generated by the PD 32, the FD 38 accumulates the transferred charge, the reset transistor 36 resets the level of voltage of the FD 38, and the amplifying transistor 42 converts the charge accumulated in the FD 38 into a voltage.

The PD 32, which generates a signal charge according to the incident light, has the grounded anode and the cathode connected to the source of the transfer transistor 34. Further, the drain of the transfer transistor 34 is connected to the FD 38. The FD 38 is connected to the drain of the reset transistor 36 resetting the FD 38 and to the gate of the amplifying transistor 42 providing the charge. In addition, the sources of the reset transistor 36 and the amplifying transistor 42 are connected to the drain line 57.

Further, the drain of the amplifying transistor 42 is connected to the column signal line 53 extended in a column direction via a pixel line 51.

Moreover, the gate of the transfer transistor 34 is connected to a transfer gate line 55 extended in a row direction, and the gate of the reset transistor 36 is connected a reset line 56 extended in a row direction.

In addition, the column signal line 53 is connected to the drain of the load transistor 58 arranged on a column basis. The load transistor 58 has the grounded source and the gate connected to the load gate line 59 extended in a row direction. Hence the load transistor 58 is designed to keep running a predetermined constant current in reading a signal.

As described above, the solid-state imaging device in embodiment of the present invention includes the voltage control circuit 10 having the FDUP transistor 60 capable of raising the level of voltage of the column signal line 53 in order to increase an amount of a charge which the FD 38 can accumulate. Here, the FDUP transistor 60 has the drain connected to the column signal line 53, the source connected to the drain line 57, and the gate connected to the timing generating circuit 2 via the FDUP line 61.

Described next is an operation on the solid-state imaging device in embodiment of the present invention.

FIG. 3A is a timing diagram showing an operation of the solid-state imaging device in embodiment with no electric charge generated by the PD 32.

Figure 3B:
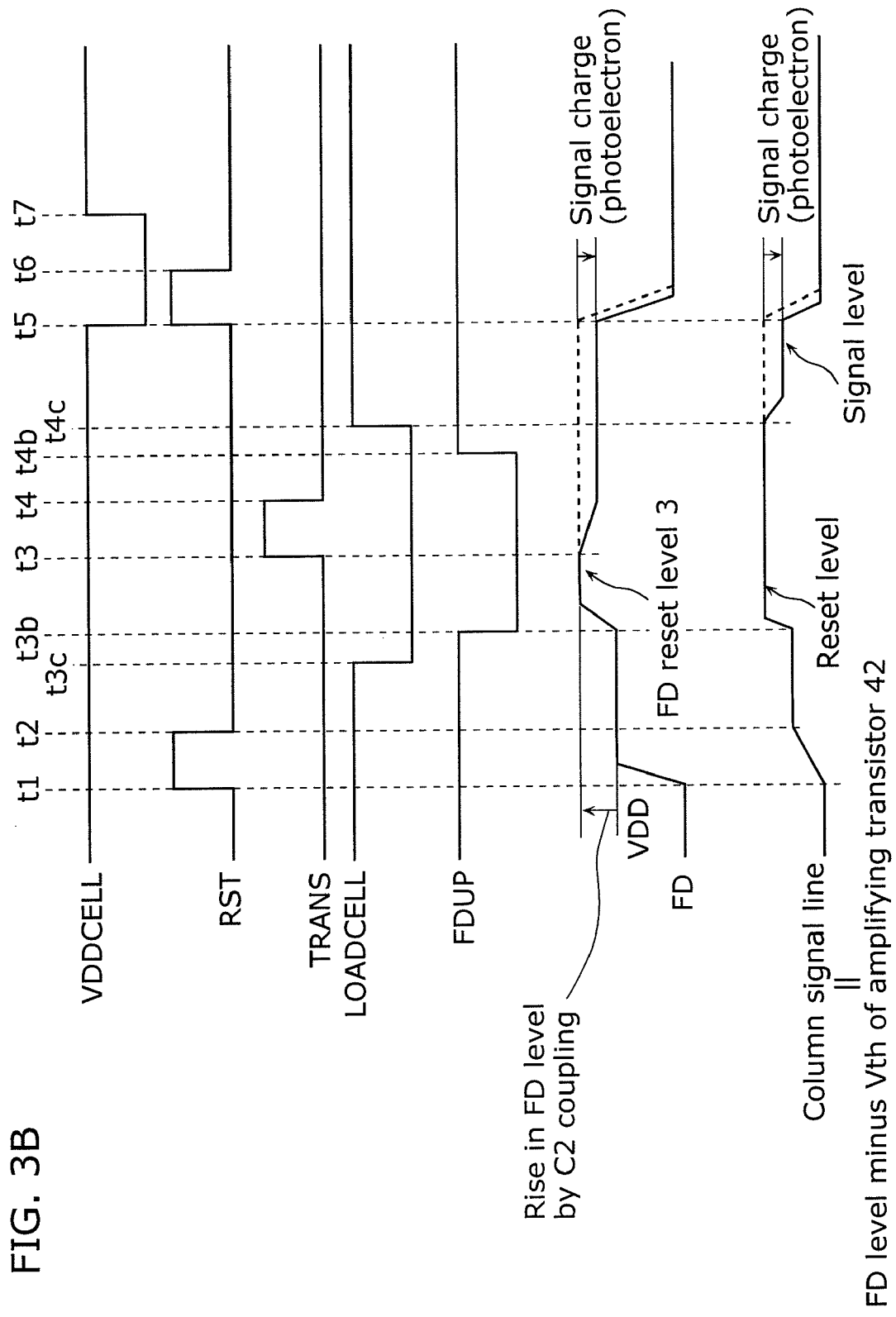
FIG. 3B is a timing diagram showing an operation of the solid-state imaging device in embodiment with an electric charge generated by the photodiode (PD) 32.

FIG. 3B is a timing diagram showing an operation of the solid-state imaging device in embodiment with an electric charge generated by the PD 32.

FIGS. 3A and 3B show the following timings: the drain driving pulse VDDCELL applied by the timing generating circuit 2 to the drain line 57; the reset signal RST applied by the multiplexer circuit 5 to the reset line 56; the transfer gate pulse TRANS applied by the multiplexer circuit 5 to the transfer transistor 34; a load transistor driving pulse LOADCELL applied by the timing generating circuit 2 to the load transistor 58; an FDUP transistor driving pulse FDUP applied by the voltage control circuit 10 to the FDUP line 61; the FD 38; and the column signal line 53.

With the drain driving pulse VDDCELL, the reset signal RST, the transfer gate pulse TRANS, the load transistor driving pulse LOADCELL, and the FDUP transistor driving pulse FDUP controlled, the solid-state imaging device in embodiment on the present invention sees a potential change of the FD 38 and a voltage change of the column signal line 53 according to the potential change.

The following describes an operation of the solid-state imaging device in embodiment with reference to FIGS. 3A and 3B; namely, the timing diagrams introduced in the embodiment.

First, in FIGS. 3A and 3B, the drain driving pulse VDDCELL (high level) is applied to the drain line 57, so that the drain line 57 is in a VDD level (high level). Meanwhile, the load transistor driving pulse LOADCELL (high level) is applied to the load gate line 59, so that the load gate line 59 is in a high level. Here, the high level voltage of the load transistor driving pulse LOADCELL is a level of voltage to serve as a load between the VDD level and the GND, rather than the VDD level. Further, the FDUP transistor driving pulse FDUP (high level) is applied to the FDUP line 61.

Next, when the reset signal RST (high level) is applied to the reset transistor 36, and the reset signal RST is raised (t1) with the FDUP line 61 brought to the VDD level (high level), the reset transistor 36 turns on, and the FD 38 becomes the VDD level (high level) (t1 to t2).

Then, the reset signal RST falls (t2). Following the fall, a fall of the load transistor driving pulse LOADCELL (t3c) causes the load transistor 58 to turn off and the column signal line 53 to be in a floating state.

Then, when the FDUP transistor driving pulse FDUP falls (t3b), the FDUP transistor 60 which is a p-type MOS transistor turns on, and the level of voltage of the column signal line 53 is pulled up as high as the same VDD level of the drain line 57. Here, the rise of the column signal line 53 and the coupling effect of the parasitic capacitance C2 raise the reset level of voltage (FD reset level of voltage) of the FD 38 greater than the VDD level, which leads to an increase in the FD capacitance (t3b to t3 in FIG. 3A) (Hereinafter referred to as the coupling effect of the C2).

Then, in the case where no incident light is transferred into the PD 32 and no signal charge (photoelectron) is accumulated in the PD 32, application of the transfer gate pulse TRANS (high level) to the transfer transistor 34 (t3 to t4) causes the level of voltage of the FD 38 to remain to be the FD reset level of voltage 3 with no change (t3 to t4c in FIG. 3A) even though the transfer transistor 34 turns on.

Figure 9B:
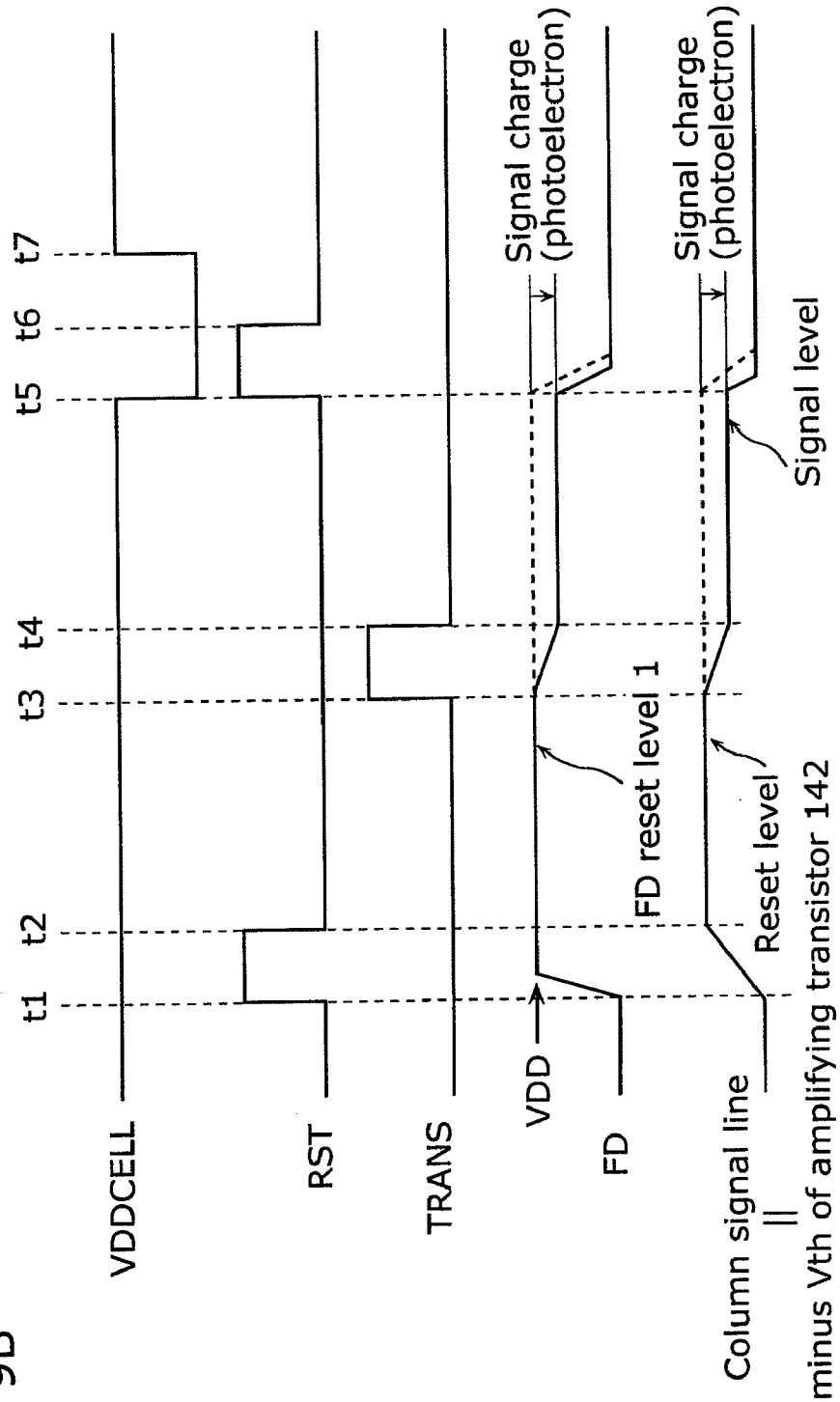
FIG. 9B is a timing diagram showing an operation of the conventional solid-state imaging device with an electric charge generated by the photodiode (PD) 132.
Figure 10:
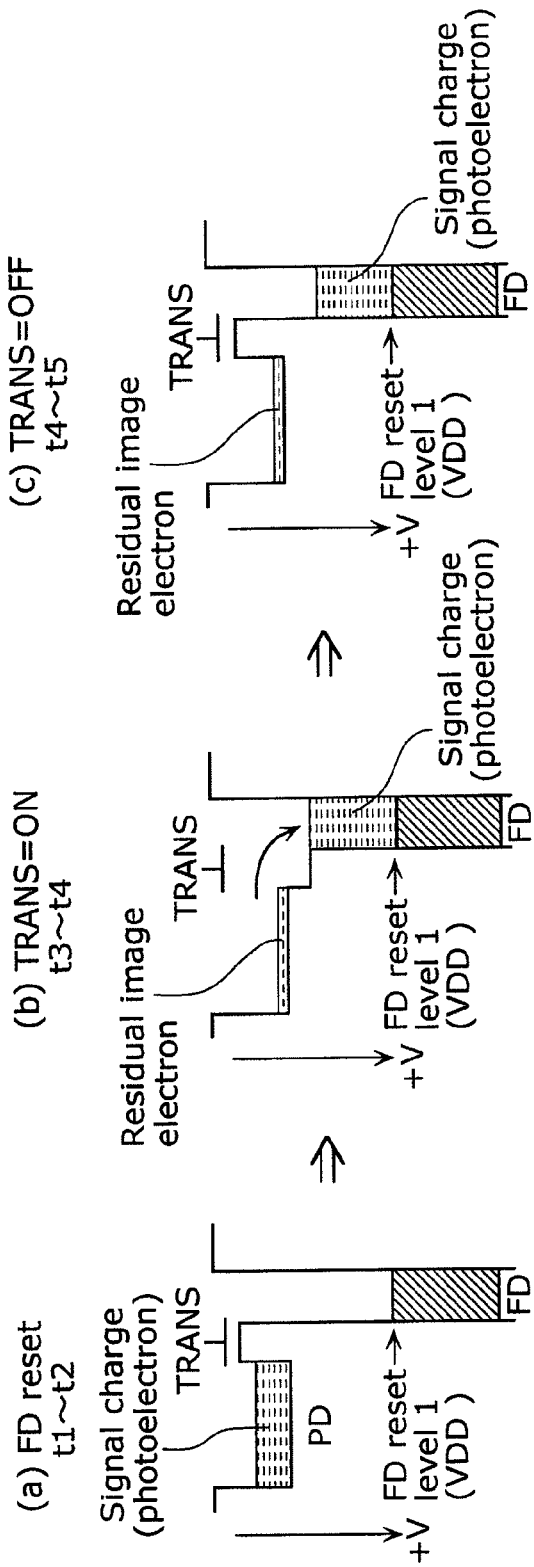
FIG. 10 shows potentials of the photodiode (PD) 132 and the floating diffusion (FD) 138 in the conventional solid-state imaging device.
Figure 11B:
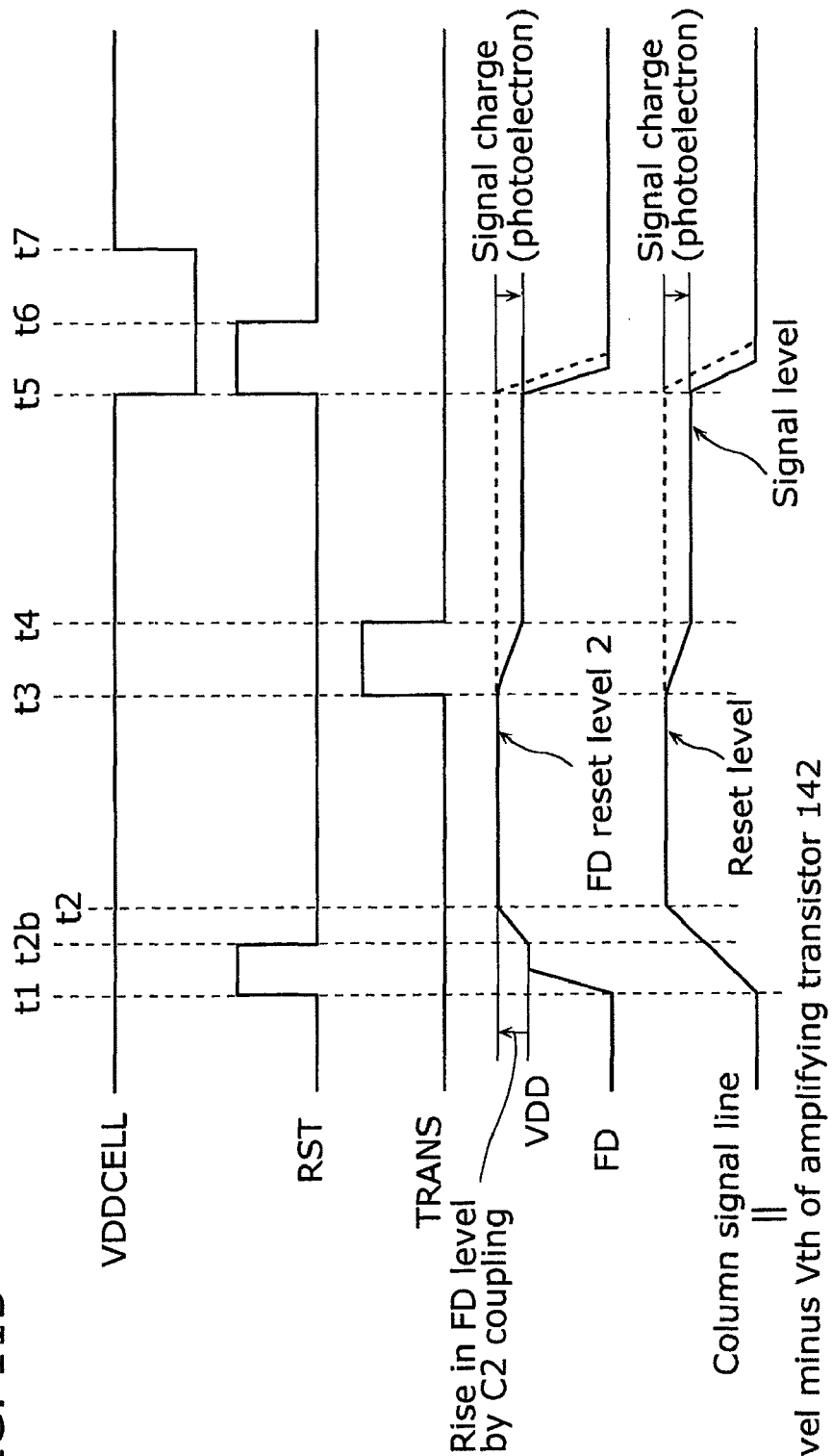
FIG. 11B is a timing diagram showing an operation of the conventional solid-state imaging device in Patent Reference 1 with an electric charge generated by the photodiode (PD) 132.

Meanwhile, when incident light is transferred into the photodiode (PD) 32, and thus a signal charge (photoelectron) is accumulated in the photodiode (PD) 32, the signal charge (photoelectron) is transferred from the photodiode (PD) 32 to the floating diffusion (FD) 38, and then the level of voltage of the floating diffusion (FD) 38 goes low depending on the signal charge (photoelectron). Here, the FD reset level of voltage 3, a reset level of voltage of the FD 38 in the present invention, is higher than the conventional example (the FD reset level of voltage 1 in FIG. 9B) and Patent Reference 1 (the FD reset level of voltage 2 in FIG. 11B). Hence, the signal charge (photoelectron) of the PD 32 can move easily to the FD 38 in transferring (t3 to t4 in FIG. 3B). This makes possible overcoming the problem of remaining residual image electrons in the PD 32.

Then, the FDUP transistor driving pulse FDUP is raised (t4b in FIG. 3B), the FDUP transistor 60 turns off, and the column signal line 53 becomes a floating state (t4b to t4c).

Following the above, raising the load transistor driving pulse LOADCELL (t4c) causes the level of voltage of the column signal line 53 to go low from the level of voltage of the FD 38 to the level of voltage by the drain-gate voltage (Vth) of the amplifying transistor 42, following the level of voltage of the FD 38 (t4c to t5).

The potential (signal level) of the vertical signal line 53 is provided again to the circuit in the next stage.

Next, the drain driving pulse VDDCELL is set to a low level, and the reset signal RST (high level) is applied to the reset transistor 36 (t5 to t6). Then, the FD 38 is brought to the low level (from t5 downward). The circuit in the next stage detects the difference between the reset level and the signal level, and forwards the difference as a pixel signal.

Described next are the potentials of the PD 32 and the FD 38 when incident light is transferred into the PD 32 and signal charge (photoelectron) is accumulated in the PD 32 of the solid-state imaging device in embodiment.

Figure 4:
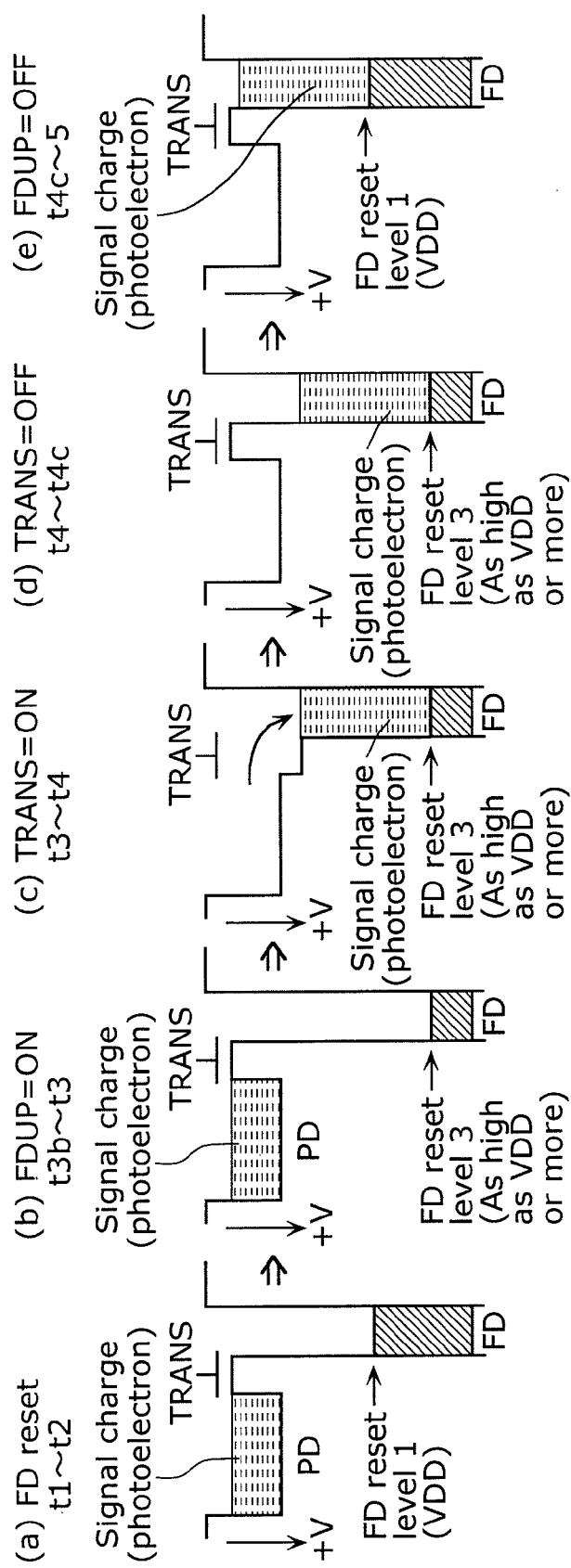
FIG. 4 shows potentials of the photodiode (PD) 32 and a floating diffusion (FD) 38.

FIG. 4 shows potentials of the photodiode (PD) 32 and the floating diffusion (FD) 38. The horizontal direction indicates locations of the photodiode (PD) 32 and the floating diffusion (FD) 38, and the vertical direction indicates potentials (high as indicated bottom).

Receiving the incident light, the photodiode (PD) 32 generates the signal charge (photoelectron).

Then, when the reset signal RST (high level) is applied to the reset transistor 36, and the level of the reset line 56 is raised with FDUP transistor driving pulse FDUP being in the VDD level (high level) (t1), the reset transistor 36 turns on, and the FD 38 turns to be in the VDD level (high level) (FIG. 4(a)).

Next, a fall of the load transistor driving pulse LOAD-CELL causes the column signal line 53 to be in a floating state.

Following the above fall, the FDUP transistor driving pulse FDUP falls, and the FDUP transistor 60 turns on. Thus, the level of voltage of the column signal line 53 is pulled up by the VDD level. Here, the rise of the column signal line 53 and the coupling effect of the parasitic capacitance C2 raise the level of voltage of the FD 38 up to the FD reset level of voltage 3 higher than the VDD level (FIG. 4(b).

Then, when the transfer gate pulse TRANS (high level) is applied to the transfer transistor 34, the signal charge (photoelectron) generated at the PD 32 is transferred to the FD 38 (FIG. 4(c)). Here, the level of voltage difference between the level of voltage of the FD 38 and the level of voltage of the PD 32 becomes greater than that of the conventional solid-state imaging device. Thus the electrons are transferred to the FD 38 rather than remaining in the PD 32.

Next, when the transfer gate pulse TRANS becomes a low level again, the photodiode (PD) 32 and the floating diffusion (FD) 38 are blocked (FIG. 4(d)).

Following the blocking, the FDUP transistor driving pulse FDUP is raised and the FDUP transistor 60 is turned off. Then, raising the load transistor driving pulse LOADCELL (t4c) causes the level of voltage of the column signal line 53 to go low from the level of voltage of the FD 38 to the level of voltage by the drain-gate voltage (Vth) of the amplifying transistor 42, following the level of voltage of the FD 38 (FIG. 4(e)).

As described above, FIGS. 3A, 3B, and 4 show that the present invention may be capable of bringing high the reset level of voltage of the FD 38 to increase the FD capacitance in a period of transferring the charge of the PD 32 since the voltage control circuit 10 employs a function and a driving technique to bring high the level of voltage of the column signal line 53.

In other words, since the FDUP transistor 60 in the present invention forces to bring high the level of voltage of the column signal line 53 up to the VDD level, the rise of the FD level of voltage thanks to the coupling effect of the C2 is greater than that observed in Patent Reference 1. Thus, the FD reset level of voltage 3 in FIG. 3B can rise higher than the FD reset level of voltage 2 in FIG. 11B.

This can overcome a problem of creating a residual image due to a remaining charge in PD 32 because of an insufficient FD capacitance, and the resulting effect is superior to that offered by Patent Reference 1.

Further, the present invention is different from Patent Reference 1 in that the FDUP transistor 60 forces to bring high the level of voltage of the column signal line 53 up to the VDD level to obtain a coupling effect of the C2 when the reset signal RST is in a low level, and the reset transistor 36 is off; that is, the FD 38 is in a floating state ((t2 to t3b) in FIG. 3B). This overcomes another problem of obtaining an insufficient coupling effect of the C2 and the resulting insufficient rise of a floating diffusion (FD) caused by a limited period to be able to obtain the coupling effect of the C2.

Modification 1 of Embodiment

Described next is Modification 1 of the embodiment in the present invention.

A solid-state imaging device in the modification includes the gate of the FDUP transistor 60 connected to a bias line having a voltage higher than that of the drain line 57.

Mainly described hereinafter are points different from embodiment of the present invention.

Figure 5:
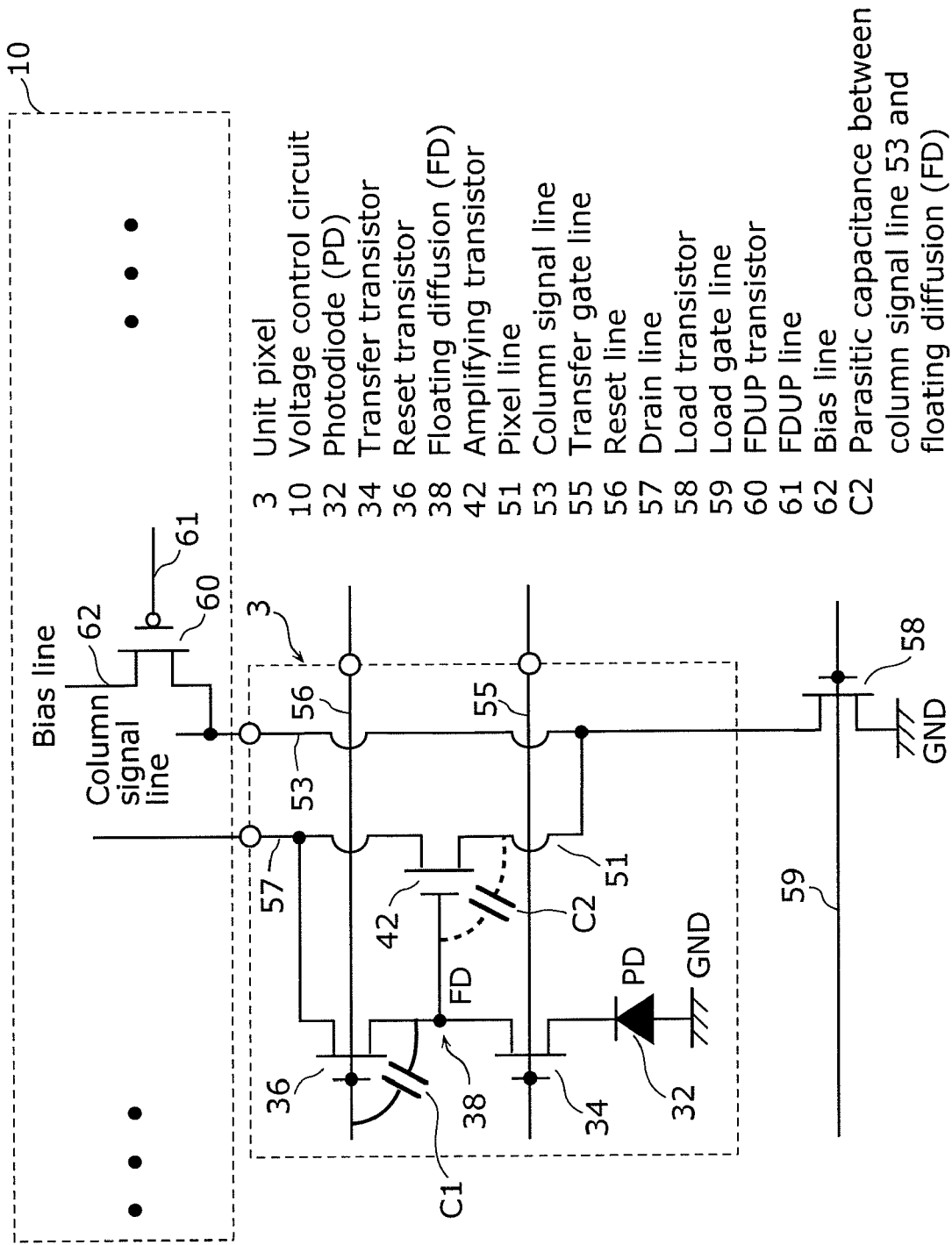
FIG. 5 is a circuit diagram showing structures of a unit pixel and a circuit surrounding the unit pixel in a modification of the embodiment.

FIG. 5 is a circuit diagram showing a structure of a unit pixel and a circuit surrounding the unit pixel in the modification.

The source of the FDUP transistor 60 in the modification is connected to a bias line 62 having a voltage higher than that of the drain line 57 in order to bring high the level of voltage of the column signal line 53. For example, the bias line 62 has a bias voltage; that is, a voltage of the drain line 57 boosted by a charge pump circuit.

Since this allows the solid-state imaging device of the modification to further increase a rising amplitude of the column signal line 53, the coupling effect of the C2 is greater than that of embodiment, and the level of voltage of the FD 38 can be raised as the coupling effect of the C2 increases.

Modification 2 of Embodiment

Described next is Modification 2 of embodiment in the present invention.

A solid-state imaging device in the modification includes a cell having plural unit pixels each including one photodiode and one transfer transistor. Chiefly described hereinafter are points different from embodiment of the present invention.

Figure 6:
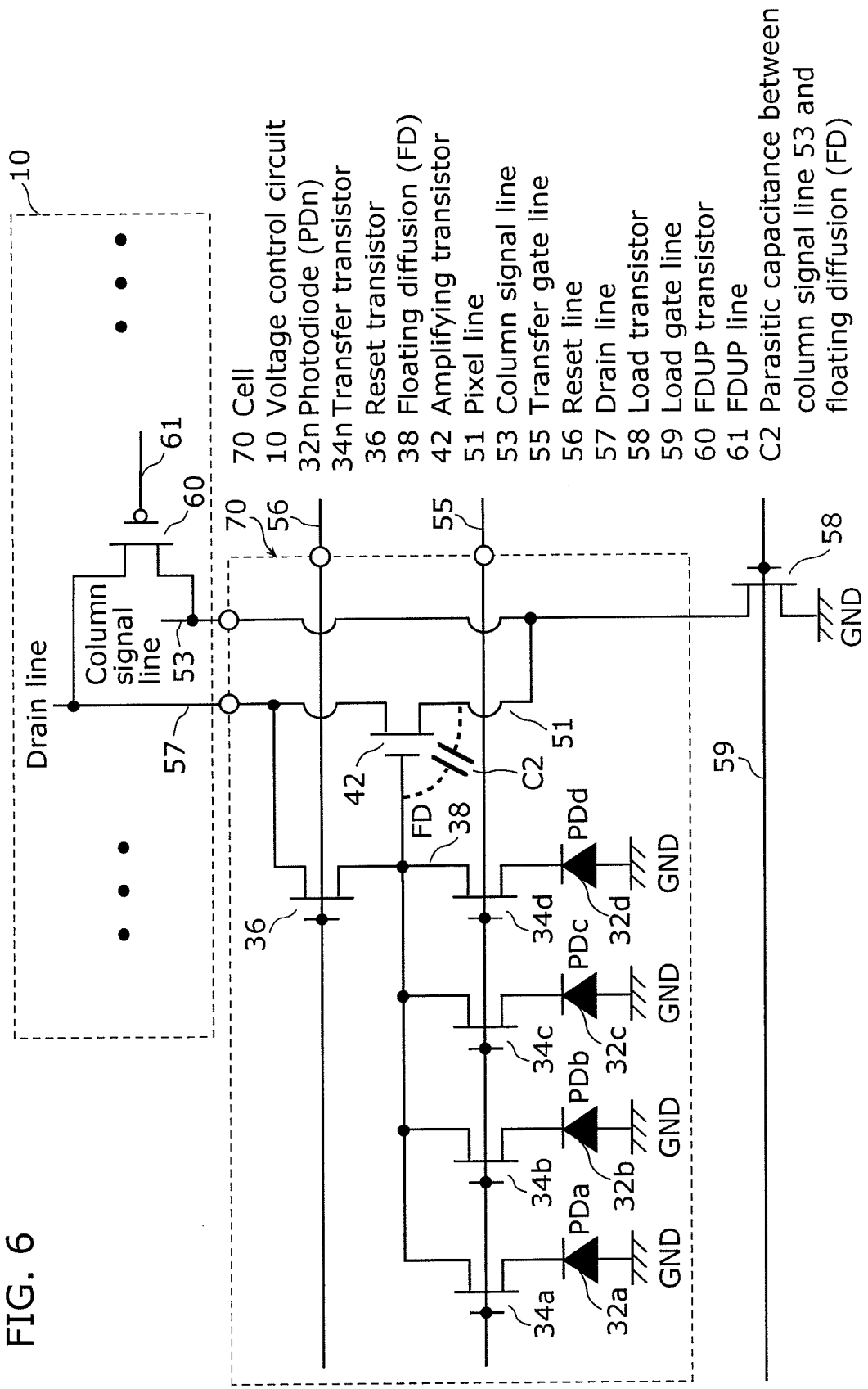
FIG. 6 shows structures of a cell and a circuit surrounding the cell in the modification.

FIG. 6 shows a structure of a cell and a circuit surrounding the cell in the modification. The solid-state imaging device in the modification includes a cell 70 each having four unit pixels. Here, each unit pixel has one of photodiodes 32a (PDa) to 32d (PDd) and one of transfer transistors 34a to 34b.

Instead of the PD 32 and the transfer transistor 34 in embodiment, the cell 70 includes the plural photodiodes 32a (PDa) to 32d (PDd) and the plural transfer transistors 34a to 34d.

Each of the photodiodes 32a (PDa) to 32d (PDd) generates a signal charge corresponding to an incident electromagnetic wave. One end of the photodiode is connected to the GND and the other end connected to the drain of the associated one of the transfer transistors 34a to 34d.

Each of the transfer transistor 34a to 34d is connected to one of the associated photodiodes 32a (PDa) to 32d (PDd). The drain of the transfer transistor is connected to: the terminal, of one of the associated photodiodes 32a (PDa) to 32d (PDd), across from the GND; the gate connected to the transfer gate line 55; and the source connected to the FD 38.

Even though further miniaturization of solid-state imaging devices results in fewer signal charges (photoelectrons) per photodiode (PD), the above enables the solid-state imaging device in the modification to implement an imaging device making possible detecting up to higher intensity luminance and having a wide dynamic range thanks to a combination of plural photodiodes (PD) and transfer transistors, followed by an increase in the number of saturated electrons.

It is noted that each of the transfer transistors 34a to 34d may be connected to a different transfer gate line. Further, FIG. 6 shows four pixels in one cell for simplicity; meanwhile, the number of pixels shall not be limited to this.

Described next is a layout illustrating multi-pixels in one cell in the modification.

Figure 7:
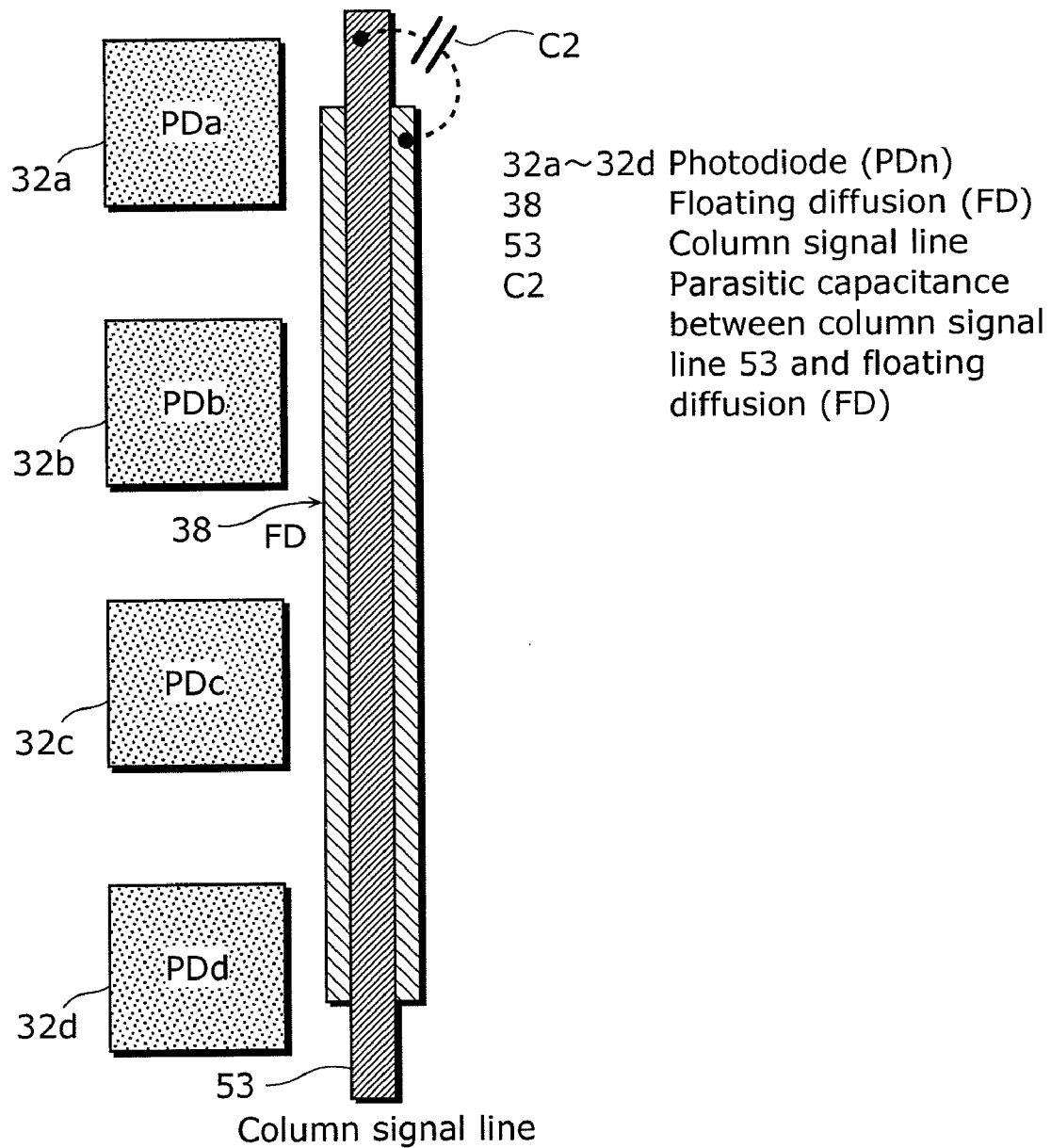
FIG. 7 illustrates a layout of the modification.
Figure 8:
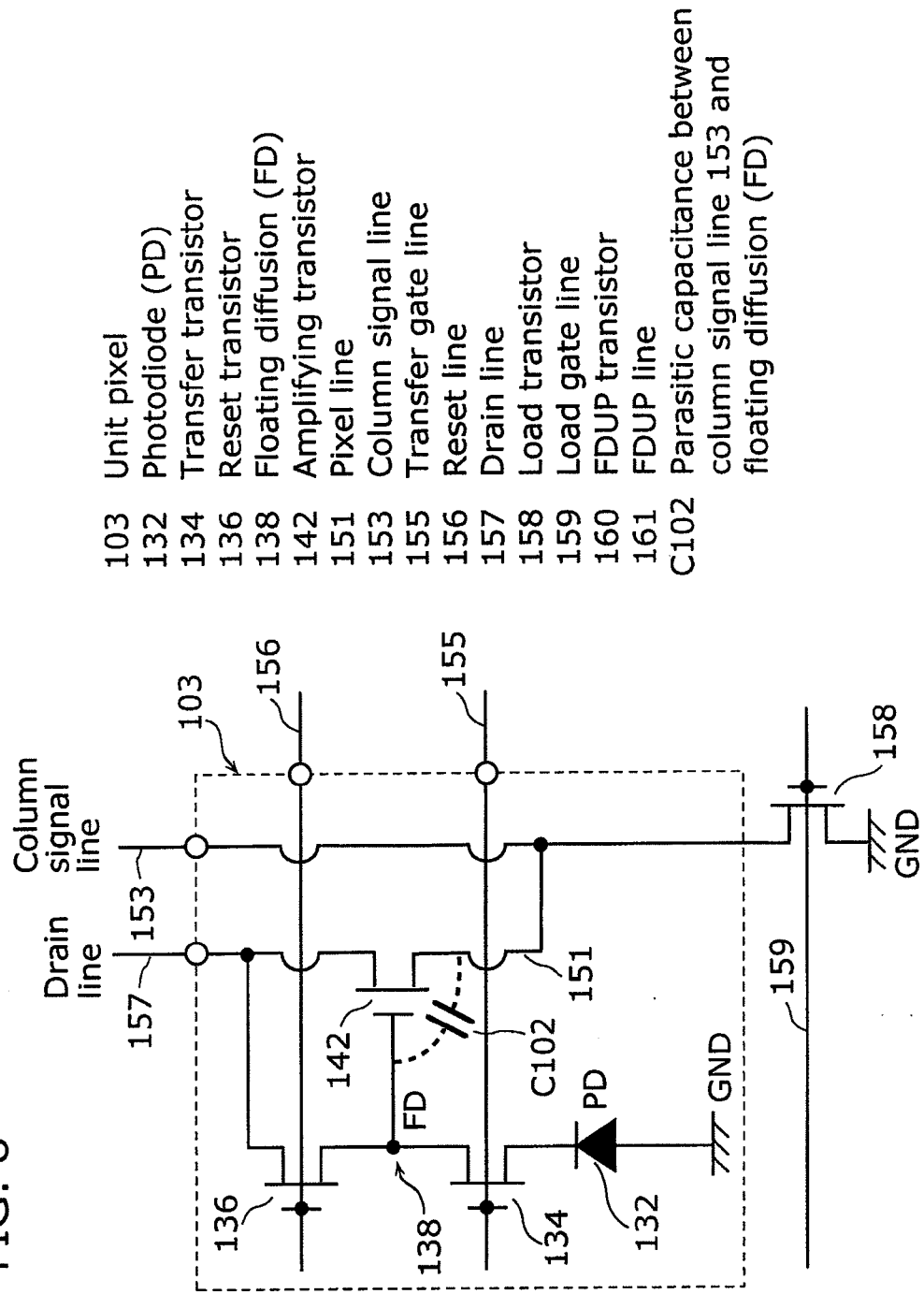
FIG. 8 is a circuit diagram illustrating a unit pixel and a circuit surrounding the unit pixel included in a conventional solid-state imaging device structured with a MOS transistor.

FIG. 7 illustrates a layout of the modification.

In implementing a layout including multi-pixels in one cell, the FD 38 in a diffusion layer as shown in FIG. 7 increases in area as the number of the photodiodes 32a (PDa) to 32d (PDd) increases. Thus, the modification is featured to have the column signal line 53, a wiring layer, arranged so that the column signal line 53 overlaps a layout of the FD 38. It is noted that FIG. 7 exemplifies the FD 38 having vertically arranged four pixels; meanwhile, the arrangement may be other than vertical, and the number of the pixels shall not be limited to four.

Thus, overlapping the column signal line 53 with the layout of the FD 38 makes possible increasing parasitic capacitances C2 for both of the FD 38 and the column signal line 53, and a coupling effect caused by the resulting rise in level of voltage of the column signal line 53 is capable of causing a further increase in level of voltage of the FD 38.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

The present invention is applicable to solid-state imaging devices used for an image inputting device including in a video camera, a digital camera, and a camera cell-phone.

What is claimed is:

1. A solid-state imaging device, comprising:
a plurality of pixel cells, arranged in a matrix, each of which includes a photodiode that photoelectrically converts incident light, a transferring transistor that transfers a charge generated by said photodiode, a floating diffusion that accumulates the transferred charge, a reset transistor that resets a potential of said floating diffusion, and an amplifying transistor that converts the charge accumulated in said floating diffusion into a voltage;
column signal lines, each connected to associated ones of plurality of amplifying transistors, including said amplifying transistor corresponding to a corresponding one of columns having said associated plurality of pixel cells; and
a voltage control circuit, including a voltage control transistor that corresponds to an associated one of said column signal lines, has a source connected to a bias line having a voltage as high as a voltage of a power supply voltage or more, and has a drain connected to said column signal line; and
a load transistor that corresponds to the associated one of said column signal lines,
wherein said column signal line is connected to a drain of said load transistor arranged on a column basis, and said load transistor has a grounded source, and
wherein said voltage control transistor turns on after said load transistor is electrically disconnected from said column signal line and before said transferring transistor turns on, and said voltage control transistor turns off after said transferring transistor turns off so that said load transistor is electrically connected to said column signal line.

2. The solid-state imaging device according to claim 1, wherein said voltage control circuit increases a voltage of said column signal line to a predetermined voltage between a reset of the potential by the reset transistor and the transfer of the charge by the transferring transistor, and
wherein said load transistor is electrically disconnected from said column signal line during a period of the transfer.

3. The solid-state imaging device according to claim 2, wherein said voltage control transistor supplies said column signal line with the predetermined voltage after the reset and prior to the transfer according to a control signal applied to a gate of said voltage control transistor.

4. The solid-state imaging device according to claim 3, wherein said voltage control transistor turns on before the period of the transfer and turns off after the transfer.

5. The solid-state imaging device according to claim 1, further comprising:
a plurality of photodiodes for said floating diffusion.

6. The solid-state imaging device according to claim 1, wherein said column signal line is arranged on an upper layer of said floating diffusion.

7. A solid-state imaging device, comprising:
a plurality of pixel cells, arranged in a matrix, each of which includes a photodiode that photoelectrically converts incident light, a transferring transistor that transfers a charge generated by said photodiode, a floating diffusion that accumulates the transferred charge, a reset transistor that resets a potential of said floating diffusion, and an amplifying transistor that converts the charge accumulated in said floating diffusion into a voltage;

column signal lines, each connected to associated ones of plurality of amplifying transistors, including said amplifying transistor corresponding to a corresponding one of columns having said associated plurality of pixel cells;

a voltage control circuit, which increases a voltage of said column signal line to a predetermined voltage between a reset of the potential by the reset transistor and the transfer of the charge by the transferring transistor, said voltage control circuit including a voltage control transistor that corresponds to the associated one of said column signal lines, has a source connected to a bias line having a voltage as high as a voltage of a power supply voltage or more, and has a drain connected to said column signal line; and a load transistor that corresponds to an associated one of said column signal lines and provides a load to each of the amplifying transistors connected to a corresponding one of said column signal lines, wherein said voltage control transistor turns on while said load transistor is electrically disconnected from said column signal line and before said transferring transistor turns on, and said voltage control transistor turns off after said transferring transistor turns off.

8. The solid-state imaging device according to claim 7, wherein said load transistor is electrically disconnected from said column signal line during a period of the transfer.

9. The solid-state imaging device according to claim 8, wherein said voltage control transistor supplies said column signal line with the predetermined voltage after the reset and prior to the transfer according to a control signal applied to a gate of said voltage control transistor.

10. The solid-state imaging device according to claim 9, wherein said voltage control transistor turns on after said load transistor is electrically disconnected from said column signal line and before the period of the transfer, and turns off after the transfer so that said load transistor is electrically connected to said column signal line.

11. The solid-state imaging device according to claim 10, further comprising:
a plurality of photodiodes for said floating diffusion.

12. The solid-state imaging device according to claim 11, wherein said column signal line is arranged on an upper layer of said floating diffusion.

* * * * *